(12) United States Patent
Wilson et al.

(10) Patent No.: US 10,128,965 B1
(45) Date of Patent: Nov. 13, 2018

(54) COUPLED INVERTER WITH AUTO-CALIBRATION

(71) Applicant: Cadence Design Systems, Inc., San Jose, CA (US)

(72) Inventors: Thomas E. Wilson, Laurel, MD (US); Moo Sung Chae, Cary, NC (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days.

(21) Appl. No.: 15/694,418

(22) Filed: Sep. 1, 2017

(51) Int. Cl.
*H04B 17/21* (2015.01)
*H04B 1/16* (2006.01)

(52) U.S. Cl.
CPC .............. *H04B 17/21* (2015.01); *H04B 1/16* (2013.01)

(58) Field of Classification Search
CPC ........ H01L 2924/14; H03B 2200/0082; G01K 15/00; G01K 15/005; H03K 3/011; H03K 3/013; H03K 19/018528; H03K 5/1252; H03M 1/1009; H04L 25/0292
See application file for complete search history.

(56) References Cited

U.S. PATENT DOCUMENTS 9,374,093 B2 * 6/2016 Pelley ............ H03K 19/018521

* cited by examiner

*Primary Examiner* — Rahel Guarino
(74) *Attorney, Agent, or Firm* — McDermott Will & Emery LLP

(57) ABSTRACT

A device including an input configured to receive an input signal in an operational mode and to receive a reference voltage in a calibration mode is provided. The device includes a capacitor to store a reference charge based on the reference voltage and an input inverter to capture a transition of the input signal. The input inverter is coupled in series with the capacitor so that the transition of the input signal occurs when a voltage of the input signal crosses the reference voltage. The device includes an output inverter coupled in series with the input inverter to provide an output signal having a parity of the input signal. A system including the above device, and a method for calibrating the above device, are also provided.

20 Claims, 9 Drawing Sheets

COUPLED INVERTER WITH AUTO-CALIBRATION

TECHNICAL FIELD

Embodiments described herein are generally related to the field of calibration of high-speed receiver devices. More specifically, embodiments described herein are related to calibration of non-return to zero (NRZ) receiver devices used in high-density data rate random access memories.

BACKGROUND

Integrated circuits face a constraint for reduced effective area and power while increasing performance (e.g., enhanced data rates with reduced power consumption at a reduced cost). Receivers are ubiquitous devices used as buffers for signals going from a processor to a memory or vice versa. The precise control of a voltage threshold for a signal transition in a receiver affects the timing of the receiver, the jitter and the bit-error rate (BER) of the system. Accordingly, some approaches to address these issues include digitally controlled calibration of the voltage threshold in a receiver. However, digitally controlled calibration is typically valid for a specific power-voltage and temperature (PVT) environment. Therefore, this digitally controlled calibration scheme naturally requires frequent pause of the system because those PVT environments change over time. Further, digitally controlled calibration schemes typically take a long time to complete, thereby interfering with high data rate transfer in demanding environments (e.g., read/write commands in random access memories). Some approaches using auto-zeroing are not compatible with NRZ signal schemes, which are commonly used in high data rate operations.

The description provided in the background section should not be assumed to be prior art merely because it is mentioned in or associated with the background section. The background section may include information that describes one or more aspects of the subject technology.

SUMMARY

In certain aspects, a device is described. The device includes an input configured to receive an input signal in an operational mode and to receive a reference voltage in a calibration mode, a capacitor configured to store a reference charge based on the reference voltage, and an input inverter configured to capture a transition of the input signal, the input inverter coupled in series with the capacitor so that the transition of the input signal occurs when a voltage of the input signal crosses the reference voltage. The device also includes an output inverter, coupled in series with the input inverter, and configured to provide an output signal having a parity of the input signal.

In certain aspects, a system is described that includes a first receiver channel, including a first input configured to receive an input signal in a first operational mode and to receive a reference voltage in a first calibration mode, and an input inverter configured to capture a transition of the input signal when a voltage of the input signal crosses the reference voltage. The system also includes a second receiver channel configured to receive the input signal in a second operational mode, and receive the reference voltage in a second calibration mode. The system includes a multiplexer configured to provide an output signal based on the input signal in a continuous overlap of the first operational mode and the second operational mode.

In certain aspects, a method is described that includes coupling an output of an inverting gate to an input of the inverting gate in a calibration mode of a receiver, and charging a capacitor disposed between a reference voltage and the input of the inverting gate when the input and the output of the inverting gate reach an equilibrium in the calibration mode. The method also includes coupling an input of the inverting gate to an input signal through the capacitor, and interleaving an operational mode of the receiver with the calibration mode in a duty cycle.

In certain aspects, a system is described including a means for storing a reference charge based on a reference voltage, and a means for capturing a transition of an input signal, the means for storing the reference charge electrically coupled to the means for capturing a transition of an input signal so that the transition of the input signal occurs when a voltage of the input signal crosses a reference voltage. The system further includes an output inverter coupled in series with the means to provide necessary voltage gain for an output signal having rail-to-rail swing and a parity of the input signal.

BRIEF DESCRIPTION OF THE DRAWINGS

In the figures, elements and steps denoted by the same or similar reference numerals are associated with the same or similar elements and steps, unless indicated otherwise.

DETAILED DESCRIPTION

Figure 1:
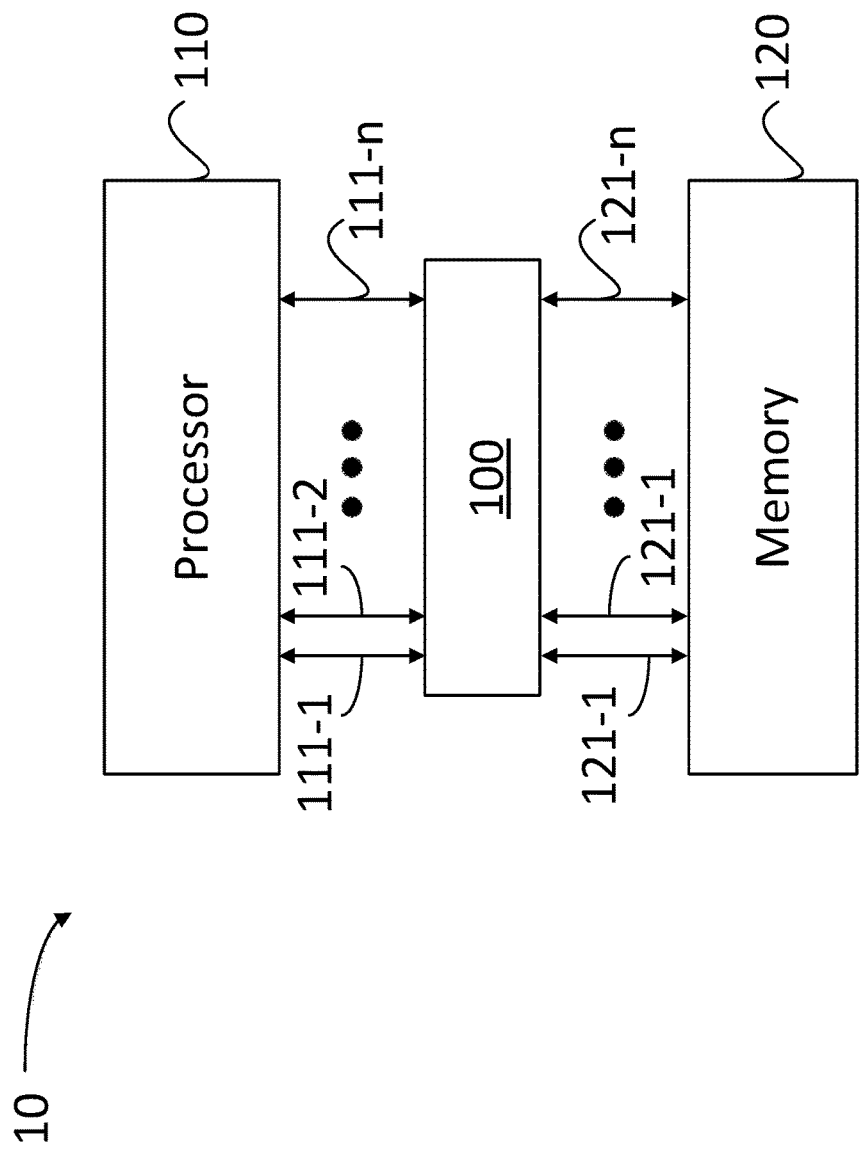
FIG. 1 illustrates a computer architecture using a DDR receiver for a memory interface, according to some embodiments.

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

General Overview

Embodiments disclosed herein include a receiver utilizing a transconductance/transimpedance amplifier coupled to a capacitor storing a reference charge. In some embodiments, the reference charge is periodically calibrated so that the receiver can better handle a variety of input conditions with superior power and timing performance, noise tolerance, and smaller area, as compared to conventional designs.

Some conventional receivers rely on a digitally controlled calibration sequence for operating calibration and offset calibration. In these approaches, multiple possible combinations of the receiver parameters are examined, values are selected that fit a calibration data best, and the selected values are used until a new calibration is initiated by the system. These implementations involve complex, time-consuming operations and naturally lead to drift because the selected values are only valid for certain environment conditions (e.g., PVT). To reduce the risk of drift, some of these systems periodically launch a re-calibration routine, forcing the halt of the receiver. Some approaches attempt to resolve this problem by auto-calibrating the input buffer of the receiver. However, these approaches naturally require an ac-coupled input to the receiver. This adds a complication for double data rate (DDR) interfaces using NRZ protocols that further require periodic auto-zeroing of the input buffer because the data is not dc-balanced. Even though the time required for the auto-zeroing is very short, e.g., a few hundred picoseconds (psec, $=10^{-12}$ sec), this inevitable periodic auto-zeroing is not compatible with the DDR interface due to the complete random nature of the memory access by itself.

Some approaches for fast and precise receivers include differential pair stages, which introduce low noise but have large areas and high power consumption. Further, differential pair receivers may include multiple buffer stages with power supplies that add noise and induce jitter. Multiple buffer stages are also undesirable because they introduce capacitance effects and terminated transmission lines, which may create spurious signals due to impedance mismatch. Accordingly, single ended receivers (e.g., DDR memory interface) are the receivers of choice in the industry, largely because of legacy and low footprint as compared to differential pair receivers.

For a single ended receiver (e.g., one input channel and one output channel), one side of the differential pair is typically tied to a reference voltage ($V_{REF}$) to form a "high" and a "low" state (e.g., '1' and '0,' respectively). $V_{REF}$ may be set to the common mode of the input signal. In some approaches, single ended receivers may include a metal-oxide-semiconductor (MOS) differential pair input, including any number of positive-channel MOS (PMOS) transistors and negative-channel MOS (NMOS) transistors. PMOS and NMOS transistors will be collectively referred to, hereinafter, as "CMOS transistors"). MOS devices are desirable to withstand large input voltages without breakdown. However, with reduced component geometries, MOS devices suffer from low gain, low bandwidth, and nonlinear behavior, thus leading to inter-symbol interference. Further, as the common mode at the input of the differential pair drops below threshold, MOS devices may shut off and become non-linear. Moreover, as the input of the differential amplifier increases, the difference between a dynamic input on one side (e.g., a PMOS transistor) and a static $V_{REF}$ on the other side (e.g., an NMOS transistor) causes nonlinearities in the differential pair, which produce coupling between the varying signal and $V_{REF}$, leading to undesirable duty cycle distortion (DCD) effects. Further, MOS devices in a differential pair configuration may include current mode logic (CML) to CMOS converter stages (e.g., for high-speed, parallel to serial data conversion). However, CML to CMOS converter stages constitute a major source of duty cycle distortion (DCD) in typical differential pair receivers.

NMOS and PMOS transistors, especially when their size is small, have mismatched physical properties, which leads to voltage offsets in a receiver, resulting in $V_{th}$ bias towards a '1', or bias towards a '0'. This causes error, jitter, and drift, because typical receivers (e.g., DDR receivers) calibrate themselves using the value of $V_{th}$, which depends on environmental conditions. Temperature and power supply voltage, $V_{dd}$, also affect the value of $V_{th}$.

Embodiments of the present disclosure include single ended receivers with reduced circuitry and reduced voltage and power requirements, thus enabling robust circuit operation even under extreme PVT variations. In addition, receivers as disclosed herein may avoid the criticality of high-voltage MOS corners in PVT space, as the devices are expected to operate away from those areas.

In some embodiments, self-calibrating receivers as disclosed herein are more robust, relative to the performance and quality of CMOS transistors used therein, which become less reliable at the 28 nm gate length fabrication node and lower. Accordingly, use of interleaved, self-calibrating receiver channels as disclosed herein allows the use of readily available and low cost components in the device, as manufacturing and environmental variations are compensated in real time, without interruption of an output signal.

Receivers as disclosed herein greatly reduce simultaneous switching output (SSO) noise, as fewer transistors are used in the receiver, and suppress signal drift. Furthermore, periodic auto-calibration steps repeated at frequencies of a few hundred mega-Hertz (MHz, wherein 1 MHz=$10^6$ Hz) reduce sensitivity to low-frequency power supply noise in embodiments consistent with the present disclosure. Accordingly, embodiments as disclosed herein relax the constraints on supply voltages, so that a lower supply voltage may no longer become a hard failure point (e.g., in a PVT corner). In addition, embodiments as disclosed herein enable the reliable use of fewer buffer stages for the output signal, thereby eliminating jitter injected by the power supply noise in the multiple buffer stages.

The impact of common mode values and signal values on noise, jitter, distortion, and other signal quality parameters may be substantially reduced by self-calibrating and interleaving multiple receiver channels. This enables the use of receivers as disclosed herein for high data rate applications (e.g., 10 GB or more for a DDR memory interface).

In some embodiments, a receiver as disclosed herein includes a multiplexer that combines the output of multiple self-calibrated receiver channels according to a selected timing diagram. The timing diagram is selected to avoid destroying a reference charge stored in a capacitor, or overcharging the capacitor. Therefore, a reference voltage for the receiver may be maintained over multiple PVT conditions by ensuring that the reference charge is not altered by an operational mode of the receiver.

FIG. 1 illustrates a computer architecture 10 using a receiver 100 to receive input data 111-1, and 111-2 through 111-n (hereinafter, collectively referred to as "input voltage 111") over as many ports from a processor 110, according to some embodiments. In some embodiments, receiver 100 may include a memory interface such as a DDR memory interface. Accordingly, receiver 100 may be disabled and a pin therein may be configured as a transmitter to provide output data 121-1 through 121-n to a memory 120, for storage. Further, in some embodiments, processor 110 may include a controller, and memory 120 may include a dynamic, random access memory (DRAM).

In some embodiments, a receiver 100 is configured to operate at a data rate of 3200 (MT/s, 1 MT/s=$10^6$ transfers/s) MT/s to 4266 MT/s per bit to be compatible with a wide variety of electrical protocols such as DDR2, DDR3, DDR4, Low Power DDR3 (LPDDR3), LPDD4, LPDDRL, open NAND flash interface (ONFI), high bandwidth memory (HBM), and the like, so that a system is compatible in a variety of different DRAM devices. Accordingly, receiver 100 may be configured to operate at electrical signal levels and termination impedances that vary widely and are usually programmable to optimize the reflections, signal size, and BER of architecture 10. For example, receiver 100 may be configured to accept input signals that vary from a few tens of millivolts (mV) to 1.5V in amplitude, with a common mode that can vary over nearly 1.5V as well. DDR standards also expect a single ended receiver for data signals and a differential receiver for clock signals, which desirably have matched performance to avoid corrupting the data-to-clock relationship of the parallel bus. The receivers may be implemented in CMOS process nodes (e.g., in the 7 nm to 28 nm range) and operate with core supply voltages ($V_{DD}$) in the range of about 0.6V to about 1.1V and Input/Output supplies ($V_{DDQ}$) in the 0.3 to 1.5V range. The environment conditions of operation of receiver 100 are challenging because of supply noise generated by processor 110 and the self-generated noise from the Input/Output ports for input signals 111 and output signals 121. Environmental conditions are further complicated by the high packing density of multiple 'n' ports in receiver 100, as well as multiple receivers 100 packed in close proximity to one another to make up the parallel DDR interface bus.

An input buffer receiver 100 may perform several calibration procedures, such as operating point calibration and offset calibration. These calibration results are valid at a certain operating condition (PVT). When the environment changes (e.g., through VT drift), receiver 100 may initiate a new calibration sequence.

Accordingly, receiver 100 may include an interleaved auto-calibrated input buffer enabling seamless operation even during a data burst in memory 120. In some embodiments, receiver 100 includes two or more independent auto-calibrated channels. Further, a multiplexer may be configured to interleave the output of the two or more channels, so that a complete, continuous buffered signal is recovered.

In some embodiments, the auto-calibration step is performed from within receiver 100 without system intervention for the re-calibration (e.g., no digital control), and allows ac-coupled input for DDR interface. Accordingly, the actual self-calibration step is "hidden" to the system by interleaving operation. Further, embodiments as disclosed herein provide an auto-calibrated receiver 100 with greatly enhanced performance/power/area.

Figure 2:
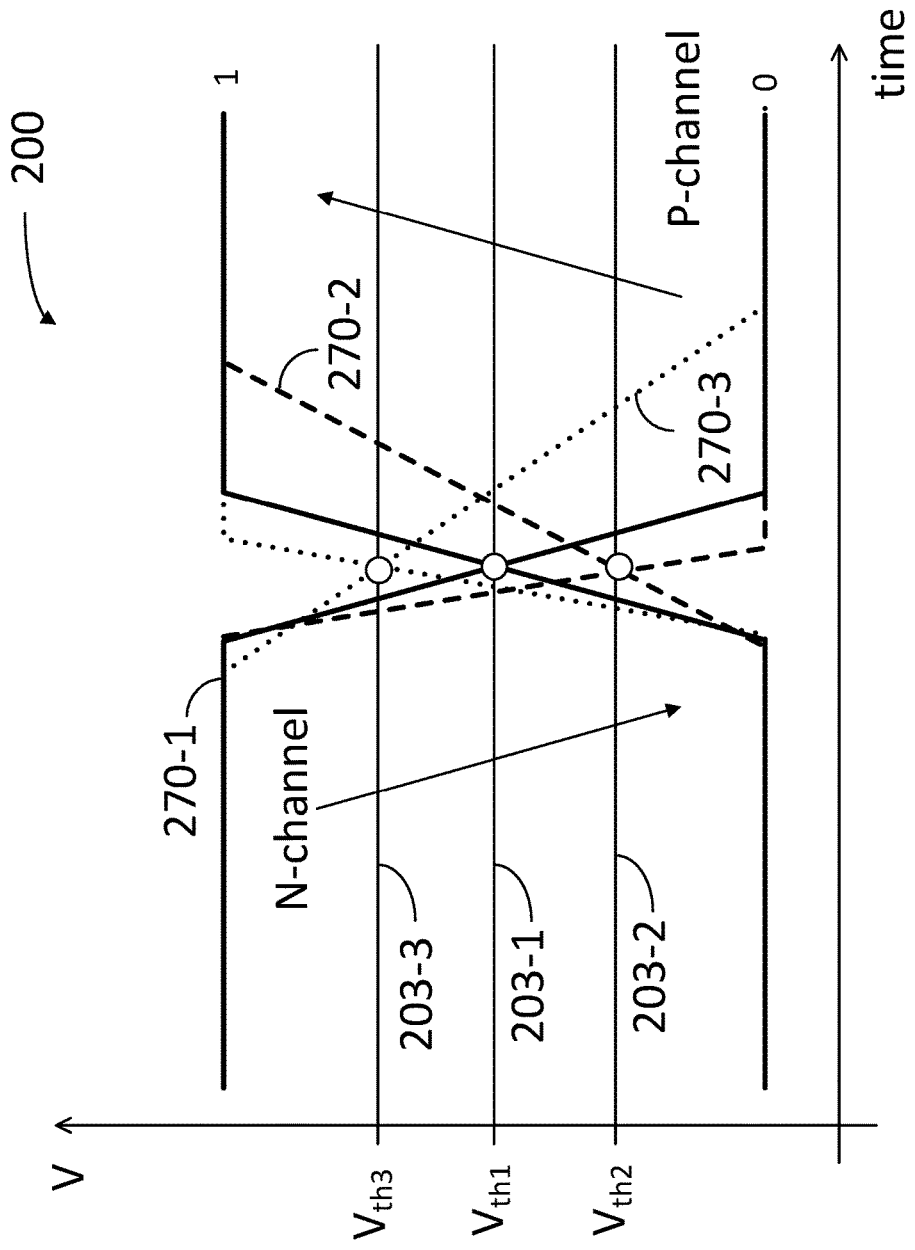
FIG. 2 illustrates a performance chart for a receiver having different threshold voltage, according to some embodiments.

FIG. 2 illustrates a performance chart 200 for a receiver 100 including signal transitions 270-1, 270-2, and 270-3 (collectively referred to hereinafter as "signal transitions 270"), according to some embodiments. Signal transitions 270 indicate "high" to "low" (e.g., 1 to 0) and low to high (e.g., 0 to 1) signal transitions in receiver 100, wherein the ordinates (Y-axis) corresponds to voltage (arbitrary units), and the abscissae (X-axis) corresponds to time (arbitrary units). Signal transitions 270 correspond to receivers having different threshold voltages: $V_{th1}$ (203-1), $V_{th2}$ (203-2), and $V_{th3}$ (203-3), respectively. $V_{th1}$ 203-1, $V_{th2}$ 203-2, and $V_{th3}$ 203-3 will be collectively referred to, hereinafter, as "threshold voltages ($V_{th}$) 203."

In some embodiments, receiver 100 includes both a PMOS transistor and an NMOS transistor in an inverter configuration. Accordingly, signal transitions 270 from a "high" level ('1') to a "low" level ('0') indicate the speed of an N-channel transistor in a differential pair. Likewise, signal transitions 270 from a "low" level ('0') to a "high" level ('1') indicate the speed of a P-channel transistor in the differential pair. In general, it is expected that the speed of an N-channel transition be affected differently than the speed of a P-channel transition by environmental conditions (e.g., PVT). Accordingly, threshold voltages $V_{th}$ 203 may move away from a middle point (e.g., $V_{th}$=0.5V for a 1 to 0, or a 0 to 1 transition) as the environmental conditions of receiver 100 change. More generally, the speed of the P-channel and the N-channel may be different even at regular PVT conditions, simply due to manufacturing variability.

For example, for transition 270-1, an approximately equal N-channel speed as a P-channel speed, may result in $V_{th}$ 203-1 approximately at the mid-point between high-low states (e.g., $V_{th1}$≈0.5V). For transition 270-2, a faster N-channel transition than a P-channel transition, $V_{th2}$ 203-2 may fall somewhat below the mid-point between high-low states (e.g., $V_{th2}$≤0.5V). For transition 270-3, a slower N-channel speed as a P-channel speed, $V_{th3}$ 203-3 may raise somewhat above the mid-point between high-low states (e.g., $V_{th3}$≥0.5V).

Figure 3:
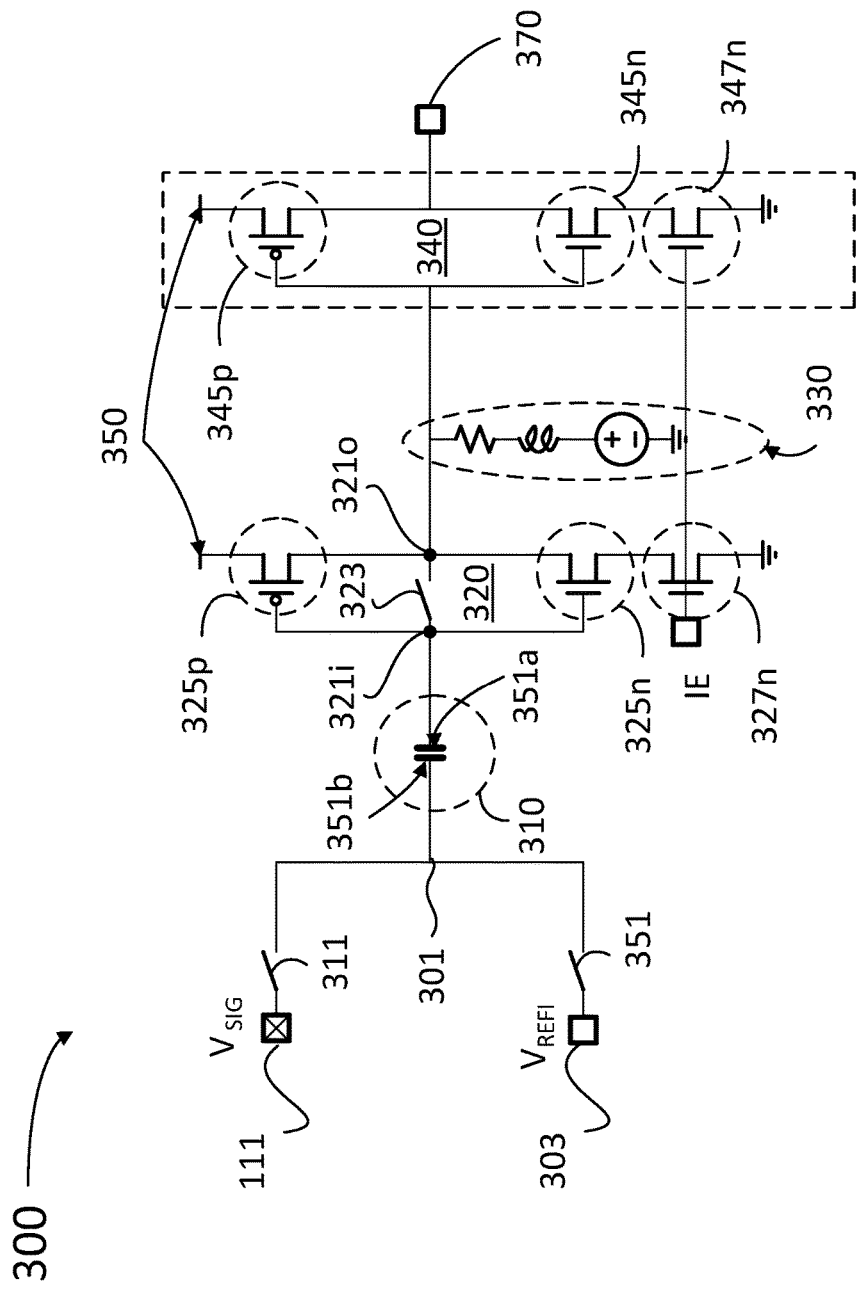
FIG. 3 illustrates a receiver including an output buffer to recover the small input signal, according to some embodiments.

FIG. 3 illustrates a receiver 300 including an input inverter 320 and an output inverter 340 to recover the input signal ($V_{SIG}$) 111, according to some embodiments. Input inverter 320 and output inverter 340 are powered by a power source 350. In some embodiments, power source 350 includes a $V_{DD}$ voltage supply for PMOS transistors 325$p$ and 345$p$. Accordingly, the voltage threshold of input inverter 320 may be affected by the voltage of power source 350. Accordingly, any noise from power source 350 will percolate into noise in voltage threshold, of input inverter 320, with the consequent effect on jitter and BER of receiver 300. In some embodiments, input signal 111 includes a digital signal configured in an NRZ protocol. Input inverter 320 and output inverter 340 are coupled to ground through NMOS transistors 325$n$ and 345$n$, respectively. Further, NMOS transistors 327$n$ and 347$n$ are configured to enable the operation of receiver 300 through an input-enable (IE) signal, as illustrated.

An input 301 is configured to receive input signal 111 in an operational mode and to receive a reference voltage 303 in a calibration mode. In some embodiments, input 301 is configured to alternate between the operational mode and the calibration mode with a duty cycle that can emphasize the operational mode over the calibration mode. For example, for input signal 111 operating at transfer rates of several Giga-Hertz (GHz, 1 GHz=$10^9$ Hz), the calibration mode may take place at a rate of about 100 or 200 MHz. Accordingly, in some embodiments, a duty cycle of the operational mode may be ten, one hundred, or even more times larger than a duty cycle of the calibration mode. Thus, embodiments as disclosed herein are able to suppress the deleterious effects of noise in power source 350 when the noise has a spectrum of up to about a few hundred MHz. Noise having a higher frequency spectrum typically has lower power (relative to input signal 111). Furthermore, higher frequency noise is typically associated with multiple transistor stages, wherein receiver 300 includes a reduced number of such stages (e.g., input inverter 320 and output inverter 340). Thus, noise in power source 350 with frequency spectrum higher than a few hundreds of MHz may be less significant in embodiments consistent with receiver 300.

In some embodiments, $V_{REF}$ 303 is constant relative to a varying environmental condition, wherein the varying environmental condition may include one of a power, a voltage, and a temperature of the device. Accordingly, receiver 300 maintains threshold voltage $V_{th}$ for input inverter 320 at the value $V_{th}=V_{REF}$, regardless of the value of $V_{com}$ for input signal 111, which may vary within a range comparable to the voltage of input signal 111 itself (e.g., up to 1.5V), and regardless of the variation in $V_{th}$ introduced by noise in power source 350. In some embodiments, VREF 303 may be proportional to the voltage of the power supply of input signal 111.

A capacitor 310 is configured to store a reference charge 351a and 351b (hereinafter, collectively referred to as "reference charge 351") based on reference voltage 303.

Receiver 300 may include an operational mode switch 311 configured to electrically couple input 301 with input signal 111 in the operational mode. Receiver 300 also includes a calibration mode switch 351 configured to electrically couple input 301 with $V_{REF}$ 303, in the calibration mode.

Input inverter 320 is configured to capture a transition of input signal 111. In some embodiments, input inverter 320 is coupled in series with capacitor 310 so that a transition of input signal 111 (e.g., from high-to-low, or from low-to-high) occurs when a voltage of input signal 111 crosses reference voltage 303.

In some embodiments, receiver 300 includes an inverter switch 323 to electrically couple (e.g., by closing the switch) an output node, 321o, to an input node, 321i, in input inverter 320, when the device is in the calibration mode (switch 351 and inverter switch 323 closed, and switch 311 open). When receiver 300 is in an operational mode (switch 351 open and switch 311 closed), input node 321i is electrically decoupled from output node 321o and input inverter 320 drives input signal 111 up or down, depending on the value of input signal 111 relative to $V_{REF}$ 303.

In some embodiments, receiver 300 includes a filter 330 to restore a high frequency component of the input signal (e.g., recover the sharp corners in a square waveform). Filter 330 may include an analog filter to re-shape input signal 111 into a proper square-shape signal, and to correct for higher frequency component losses through capacitor 310 and input inverter 320. In some embodiments, filter 330 includes a voltage limiter with a continuous time linear equalizer (CTLE).

Output inverter 340 may be coupled in series with input inverter 320 to provide an output signal 370 having the same parity as input signal 111 and that is calibrated according to $V_{REF}$ 303.

Tables I and II below illustrate results for the variability of the transition voltage for input signal 111 in an illustrative embodiment consistent with receiver 300. Columns in Tables I and II indicate three different manufacturing tolerance conditions and temperatures (N-channel speed/P-channel speed cf. chart 200, and temperature) for input inverter 320, namely: slow/slow, at −40 C., typical/typical at 25 C., and fast/fast at 125 C. Rows in Tables I and II indicate minimum/maximum variations in $V_{DD}$ voltage (e.g., from power supply 350):

TABLE I

| 3σ Vos | SSG/−40 C. | TTG/25 C. | FFG/125 C. |
|---|---|---|---|
| VDO = 0.68 V; VDDQ = 1.0 V | ±1.4 mV | ±2.2 mV | ±9.0 mV |
| VDO = 0.9 V; VDDQ = 1.3 V | ±1.7 mV | ±2.5 mV | ±5.3 mV |

TABLE II

| IVDO | SS/−40 C. | TT/25 C. | FF/125 C. |
|---|---|---|---|
| VDO = 0.68 V | 0.11 mW | 0.23 mW | 0.45 mW |
| VDO = 0.75 V | 0.18 mW | 0.35 mW | 0.66 mW |
| VDO = 0.85 V | 0.35 mW | 0.62 mW | 1.05 mW |

Figure 4A:
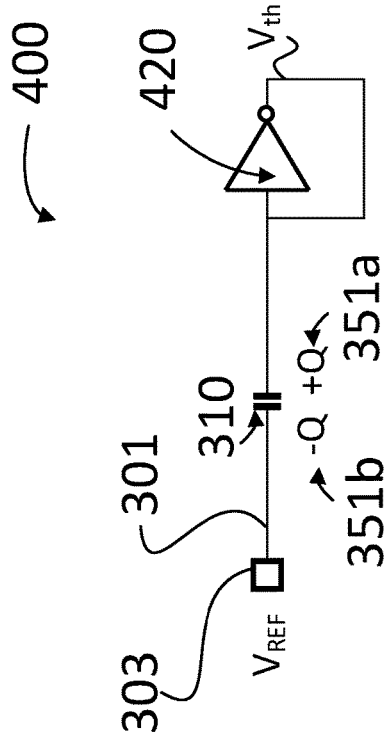
FIGS. 4A-B illustrate the charging of a capacitor for calibrating a receiver, and usage of the charged capacitor to couple signal to the input of the inverter, according to some embodiments.

FIG. 4A illustrates the charging of capacitor 310 with charges 351a and 351b (charge 351) for calibrating a receiver 400 in a calibration mode, according to some embodiments. Receiver 400 may include an input inverter 420 (e.g., input inverter 320 in receiver 300). In the calibration mode, input inverter's input and output are coupled by inverter switch 323 in receiver 300. In equilibrium, to minimize the power consumption, the output voltage of shorted input inverter 420 is $V_{th}$. In some embodiments, it is expected that $V_{th} \sim 0.5 V_{DD}$. Accordingly, in the calibration mode, capacitor 310 is charged with charge 351 so that receiver 400 reaches equilibrium when input 301 is coupled with $V_{REF}$ 303.

Figure 4B:
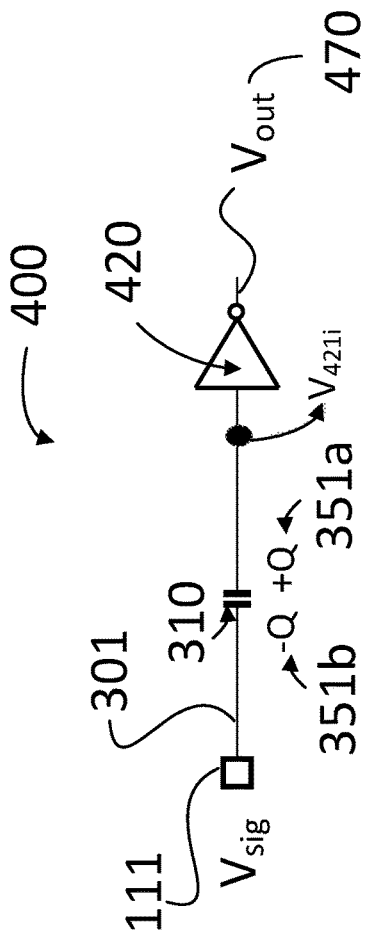

FIG. 4B illustrates input signal ($V_{sig}$) 111 received at input 301 and transitioned into an output signal ($V_{out}$) 470 for receiver 400 in operational mode, according to some embodiments. The voltage, V421i at an input node of input inverter 420 may be formulated by the following mathematical expressions:

$$Q_{351} = C_{310} \cdot (V_{ref} - V_{th}) \quad (1)$$

$$V_{421i} = V_{th} + (V_{sig} - V_{ref}) \quad (2)$$

$$V_{out} = \begin{cases} 1, & V_{sig} \geq V_{ref} \\ V_{th}, & V_{sig} \approx V_{ref} \\ 0, & V_{sig} \leq V_{ref} \end{cases} \quad (3)$$

Eq. 3 illustrates that, regardless of the $V_{th}$ value, $V_{out}$ 470 is dependent on the value of $V_{sig}$ 111 relative to $V_{REF}$ 303. The exact value of $V_{th}$ is irrelevant, as long as charges 351, collected in the calibration mode, are maintained in the operational mode. The value of $V_{REF}$ 303 is expected to be constant cross a wide range of PVT conditions of receiver 400. In some embodiments, Eq. 3 follows from Eq. 1 when charge 351 remain the same between the calibration mode and the operational mode (provided $V_{th}$ is also still the same, cf. Eq. 1). In embodiments using receiver 400 through multiple PVT points, it is reasonable to expect that charge 351 may drift, and therefore a new calibration mode step may be desirable. Further, in some embodiments, the value of $V_{th}$ may change due to environmental conditions (e.g., changing PVT conditions), as discussed above, such that charge 351 may be desirably updated to account for this change (cf. Eq. 1). In fact, in some embodiments, a calibration mode step for re-assessing the value of charge 351 in capacitor 310 may be carried out periodically, to update the value of charge 351.

Figure 5:
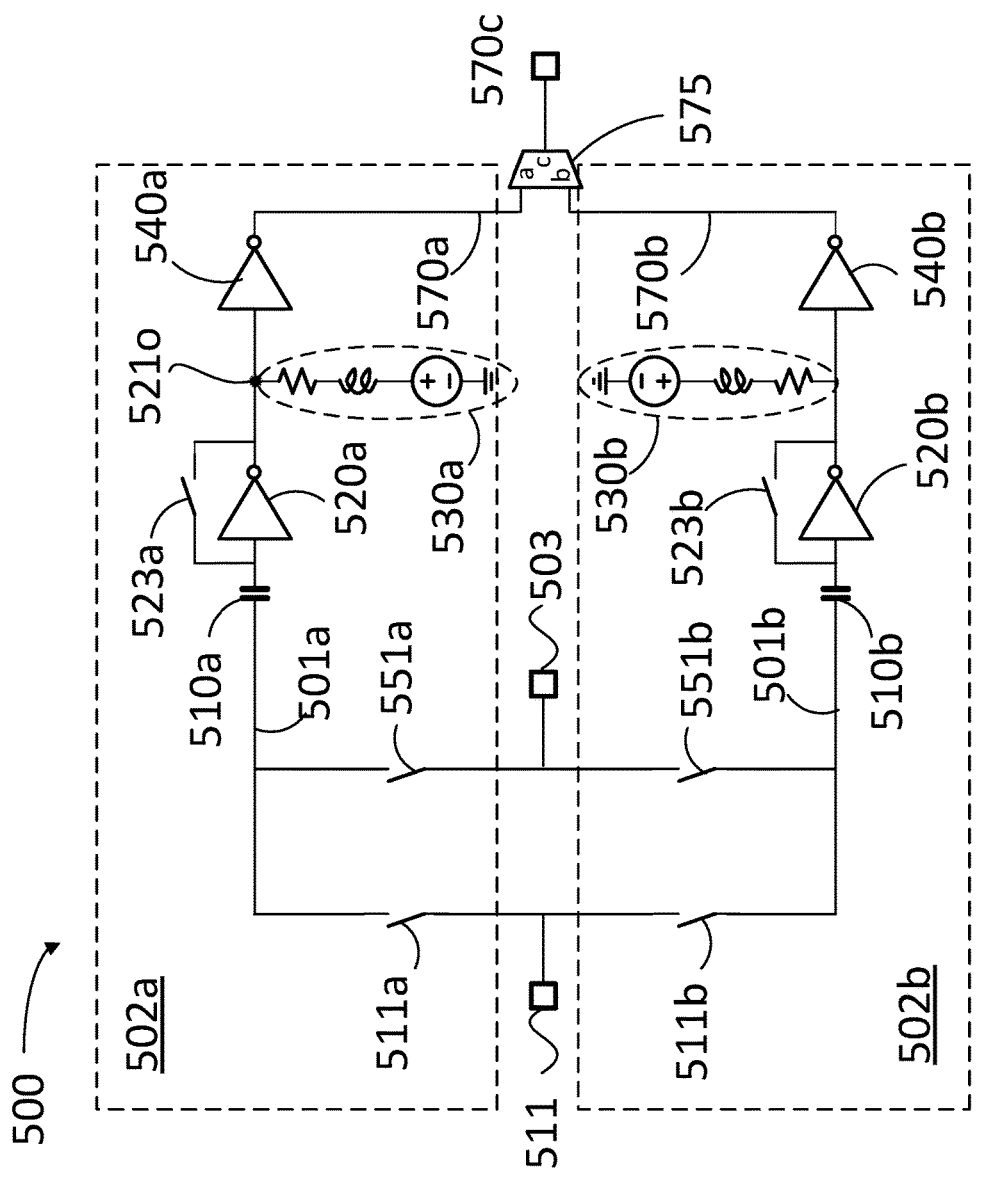
FIG. 5 illustrates two receiver channels and a multiplexer in the receiver, according to some embodiments.

FIG. 5 illustrates two receiver channels 502a and 502b (hereinafter, collectively referred to as "receiver channels 502") and a multiplexer 575 in a receiver 500, according to some embodiments. Receiver 500 includes a first receiver channel 502a having an input 501a configured to receive an input signal 511 in a first operational mode and to receive a reference voltage ($V_{REF}$) 503 in a first calibration mode. $V_{REF}$ 503 may be as $V_{REF}$ 303, that is, a constant voltage provided to receiver 500 that remains unchanged over a wide range of environmental conditions (e.g., PVT conditions). Receiver 500 also includes a first input inverter 520a configured to capture a transition of input signal 511 when the voltage of input signal 511 crosses reference voltage 503 (e.g., from above to below $V_{REF}$ 503, or from below to above $V_{REF}$ 503). In some embodiments, first input inverter 520a may be as described above with regard to input inverter 320.

In some embodiments, receiver channel 502a may include an output inverter 540a coupled in series with input inverter 520a to provide a first output signal 570a having the parity of input signal 511. Likewise to receiver 300, first channel 502a may include a capacitor 510a to store a reference charge (e.g., charges 351) when receiver channel 502a is in the first calibration mode. In some embodiments, input inverter 520a is coupled in series with capacitor 510a. Similar to receiver 300, receiver channel 502a may also include an operational mode switch 511a, to electrically couple input 501a with input signal 511 in the first operational mode of receiver 500. In addition, first channel 502a may also include a calibration mode switch 551a configured to electrically couple input 501a with $V_{REF}$ 503, and a bootstrap switch 523a to electrically couple the output and the input to input inverter 520a. Further, in some embodiments, first channel 502a includes a filter 530a coupled at a node 521o, to restore a high frequency component of the input signal (e.g., similar to filter 330 in receiver 300).

Receiver channel 502b is configured to receive input signal 511 in a second operational mode, and to receive $V_{REF}$ 503 in a second calibration mode. Receiver channel 502b may include an output inverter 540b coupled in series with input inverter 520b to provide a second output signal 570b having the parity of input signal 511. Likewise, to receiver 300 and to first receiver channel 502a, second receiver channel 502b may include a capacitor 510b to store a reference charge (e.g., charges 351) when receiver channel 502b is in the second calibration mode. In some embodiments, receiver channel 502b mirrors the components of receiver channel 502a, and provides a second output signal 570b, which follows input signal 511 when receiver channel 502b is in a second operational mode. Accordingly, receiver channel 502b may include an operational mode switch 511b configured to electrically couple input 501b with input signal 511, and a calibration mode switch 551b configured to electrically couple input 501b with $V_{REF}$ 503. Likewise, receiver channel 502b may include a bootstrap switch 523b to electrically couple the output and the input of input inverter 520a. Further, in some embodiments, receiver channel 502b includes a filter 530b to restore a high frequency component of the input signal (e.g., similar to filter 330 in receiver 300).

Multiplexer 575 is configured to provide an output signal 570c based on input signal 511 in a continuous overlap of the first operational mode and the second operational mode. Output signal 570c includes at least a portion of first output signal 570a and a portion of second output signal 570b. More specifically, in some embodiments, multiplexer 575 is configured to provide output signal 570c including first output signal 570a when receiver channel 502b is in the second calibration mode. Likewise, multiplexer 575 is configured to provide output signal 570c including output signal 570b when receiver channel 502a is in the first calibration mode. Accordingly, output signal 570c includes a seamless streaming of the data included in input signal 511.

Table III below illustrate results obtained in some illustrative embodiment of a receiver consistent with receiver 500. The columns/rows in Table III are as in Tables I and II above

TABLE III

| 3 σ delay mismatch | SSG/–40 C. | TTG/25 C. | FFG/125 C. |
|---|---|---|---|
| VDD = 0.68 V VDDQ = 1.1 V | ±5.0 ps | ±5.2 ps | ±5.0 ps |
| VDD = 0.9 V VDDQ = 1.1 V | ±4.7 ps | ±4.6 ps | ±5.6 ps |

Figure 6:
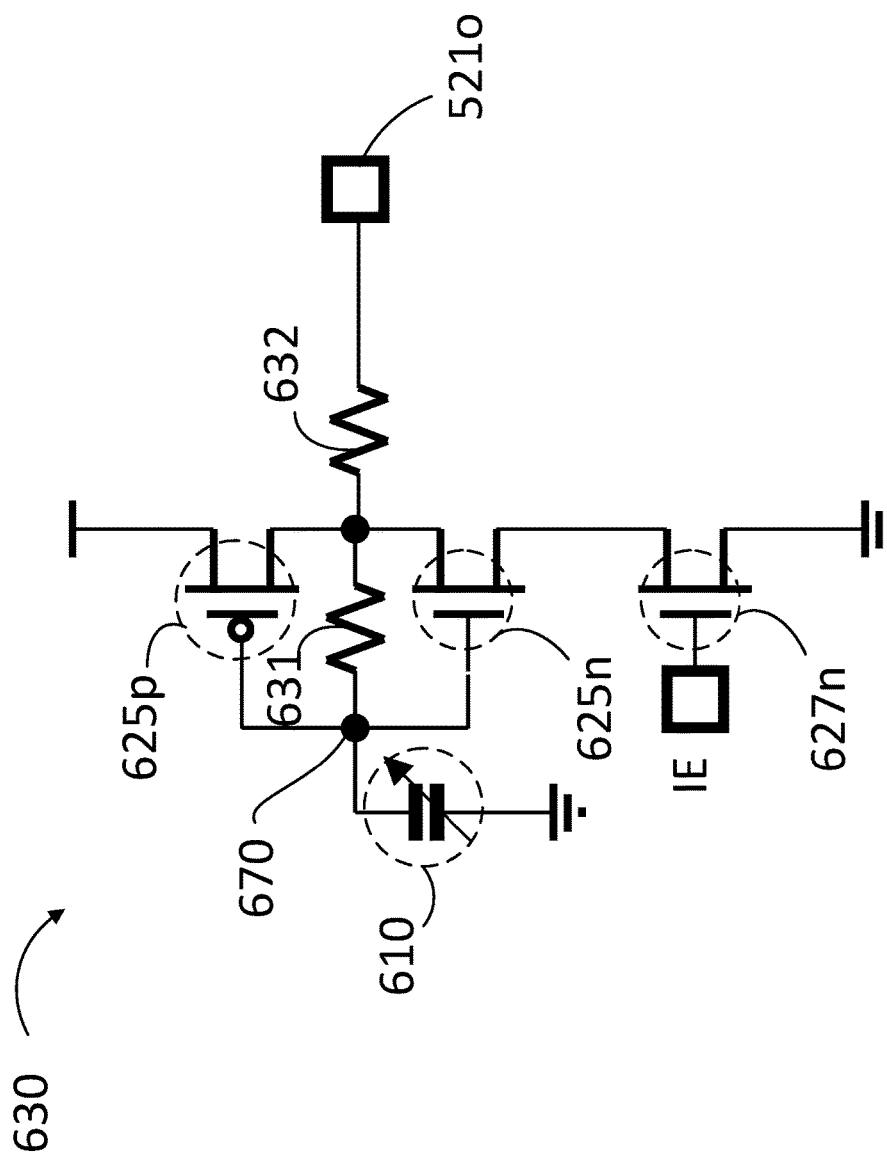
FIG. 6 illustrates a filtering circuit to recover the square profile of a signal in a receiver, according to some embodiments.

FIG. 6 illustrates a filter 630 to restore the square profile of a signal in a receiver, according to some embodiments. Node 521o receives a signal (e.g., the inverted signal at any of output nodes 321o and 521o). Resistor 63 land resistor 632 couple the signal to a PMOS transistor 625p, and to an NMOS transistor 625n arranged in an inverting configuration. A variable capacitor 610 adjust the amount of coupling according to the signal frequency. PMOS transistor 625p and NMOS transistor 625n will be collectively referred to, hereinafter, as "transistors 625." Resistor 632 couples the output of transistors 625 into a rectified output signal 670. NMOS transistor 627n enables and disables filter 630 based on an IE input at the gate.

Figure 7:
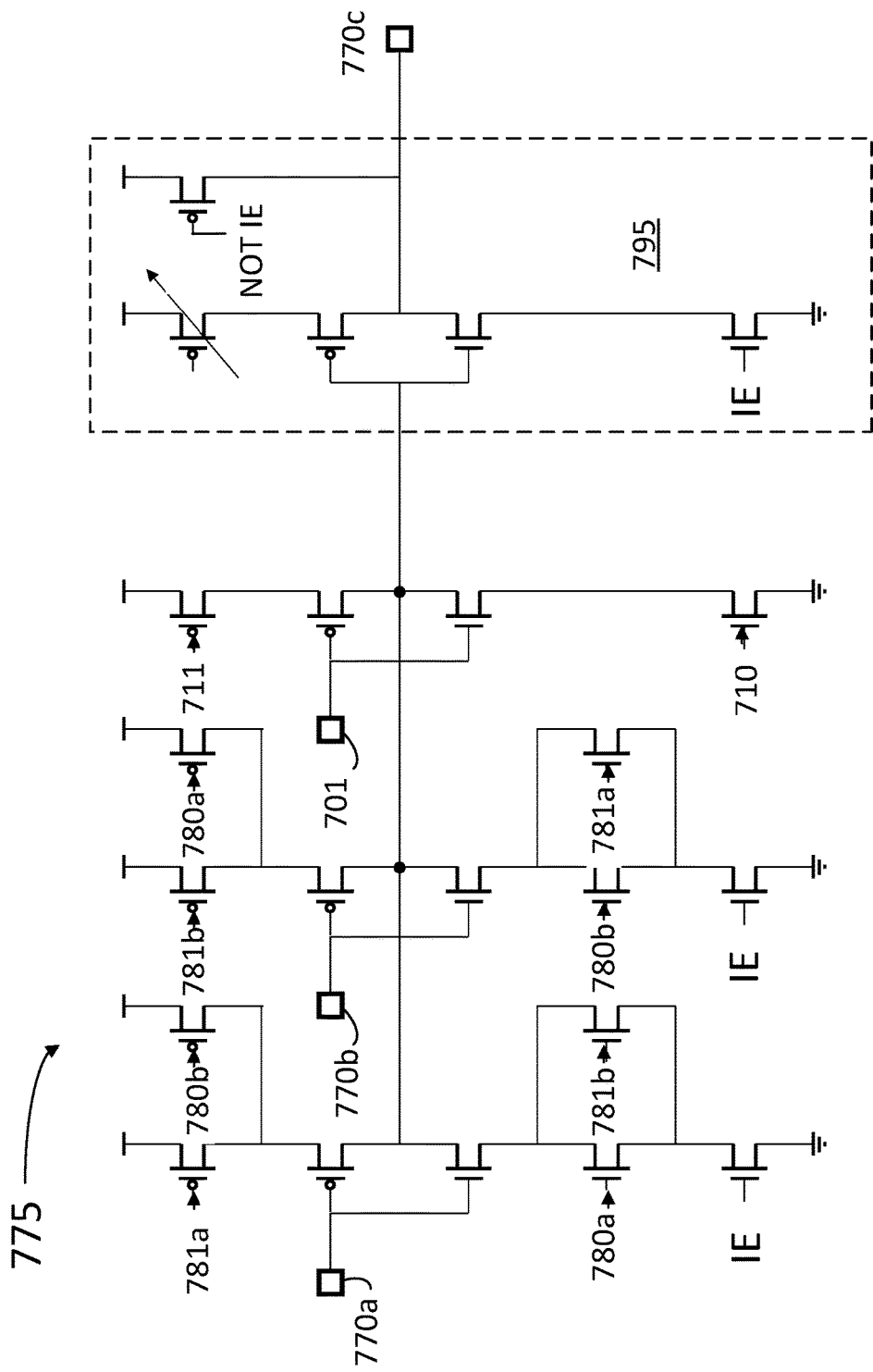
FIG. 7 illustrates a circuit diagram of a multiplexer for multiple receiver channels in a receiver, according to some embodiments.

FIG. 7 illustrates a circuit diagram of multiplexer 775 for multiple receiver channels in a receiver, according to some embodiments. A first receiver channel includes output signal 770a, and a second receiver channel includes output signal 770b, according to some embodiments. The different stages in multiplexer 775 ensure that continuous output signal 770c includes alternatively output signal 770a from an operational mode in first channel 770a, and output signal 770b from an operational mode in second channel 770b (e.g., output signals 570a and b in receiver 500). Multiplexer 775 includes multiple CMOS transistors configured to receive a first enable signal 780a and a first disable signal 781a to provide output signal 770a to continuous output signal 770c. The CMOS transistors in multiplexer 775 are also configured to receive a second enable signal 780b and a second disable signal 781b to provide output signal 770b to continuous output signal 770c.

In some embodiments, multiplexer 775 may include a bypass mode path 701 for test operations, e.g., a Joint Test Action Group (JTAG) operation. Accordingly, multiplexer 775 may include CMOS transistors configured to receive a "select" signal 710 and a "deselect" signal 711 to provide bypass mode path 701 to continuous output signal 770c for operational cases when a clock is not present. Furthermore, in some embodiments, multiplexer 775 includes a duty cycle offset stage 795 configured to further adjust an offset value for output signal 770c (e.g., to invalidate certain instances of signals 770, or bypass mode path 701 due to a calibration mismatch, or timing mismatch, and the like).

Figure 8:
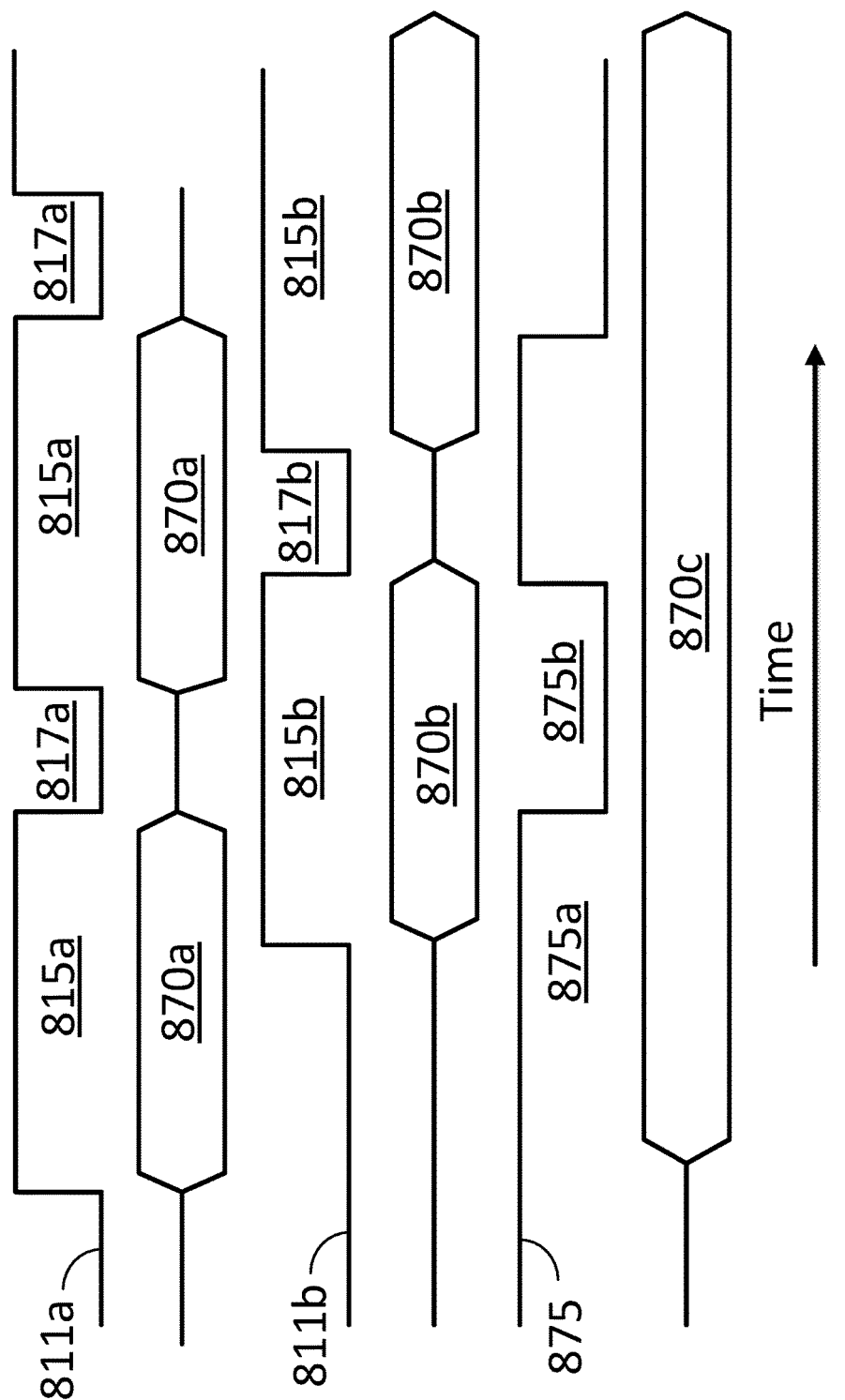
FIG.8 illustrates the duty cycle of at least two signals from two receiver channels and a multiplexer in a receiver, according to some embodiments.

FIG. 8 illustrates the duty cycle 870a and 870b of at least two signals from two receiver channels and a multiplexer in a receiver, according to some embodiments (e.g., receiver channels 501a and 501b, respectively, and multiplexer 575, in receiver 500). Enable signal 811a drives the first receiver channel over a duty cycle 870a. Enable signal 811a includes an operational mode 815a, and a calibration mode 817a, for the first receiver channel. Enable signal 811b drives the second receiver channel over duty cycle 870b. Enable signal 811b includes an operational mode 815b, and a calibration mode 817b, for the second receiver channel. Enable signals 811a and 811b will be collectively referred to, hereinafter, as enable signals 811. Operational modes 815a and 815b will be collectively referred to, hereinafter, as operational modes 815. Calibration modes 817a and 817b will be collectively referred to, hereinafter, as calibration modes 817. Duty cycles 870a and 870b will be collectively referred to, hereinafter, as duty cycles 870.

Furthermore, enable signals 811 are configured so that, operational mode 815a of the first receiver channel overlaps in time with calibration mode 817b of the second receiver channel. Likewise, operational mode 815b of the second receiver channel overlaps in time with calibration mode 817a of the first receiver channel. Furthermore, a multiplexer signal 875 selects the output from the first receiver channel as a receiver output 870c in a 'high' cycle 875a. Likewise, multiplexer signal 875 selects the output from the second receiver channel as a receiver output 870c in a 'low' cycle 875b. As a result, receiver output 870c combines the operational modes of the first receiver channel and the second receiver channel in an extended, continuous operational mode for receiver output 870c.

In some embodiments, enable signals 811 are selected so that the operational modes 815 and duty cycles 870 of the first receiver channel and the second receiver channel overlap somewhat in time. However, multiplexer signal 875 chooses one duty cycle (870a) over the other duty cycle (870b), at any given time.

Figure 9:
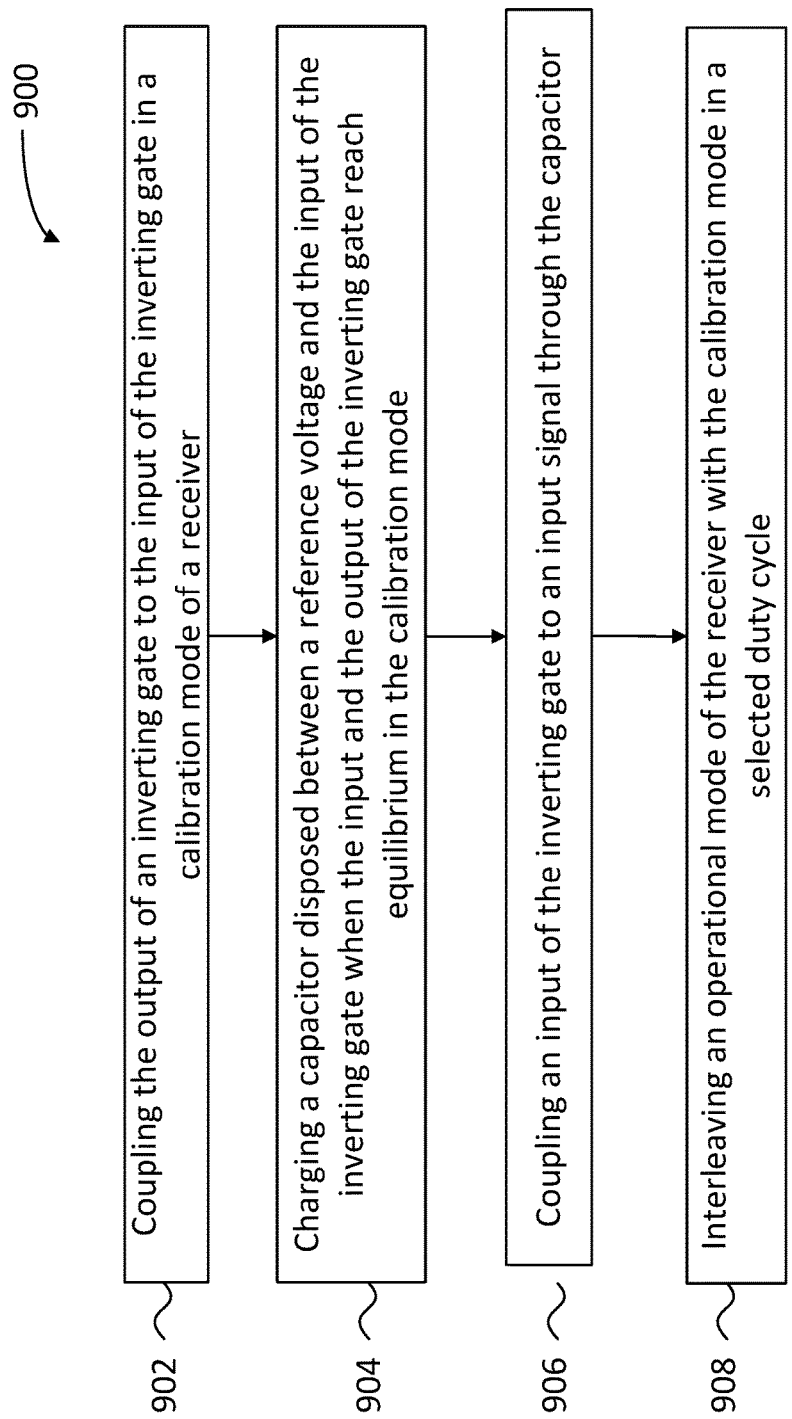
FIG.9 is a block diagram illustrating steps in a method for self-calibrating a receiver in a memory interface, according to some embodiments.

FIG. 9 is a block diagram illustrating steps in a method 900 for self-calibrating a receiver in a memory interface, according to some embodiments (e.g., receivers 100, 300, 400 and 500). A receiver in methods consistent with method 900 may include a capacitor, an input inverter, an output inverter, and multiple switches configured to alternate the receiver from a calibration mode to an operational mode (e.g., capacitors 310 and 510, input inverters 320 and 520, output inverters 340 and 540, and switches 311, 323, 351, 511, 523, and 551). Further, in some embodiments, a receiver as disclosed herein may include a first channel including the variable capacitor, the input inverter, the output inverter, and the switches, a second channel mirroring the first channel, and a multiplexer coupling the first channel and the second channel to an output (e.g., first channel 502a, second channel 502b, and multiplexer 575). The multiplexer may be configured to couple the output signal to the operational mode of the first channel and the operational mode of the second channel alternatively, so that the output signal includes a continuous interval encompassing the operational mode of the first channel and the operational mode of the second channel.

Embodiments consistent with method 900 may include at least one, but not all, of the steps in method 900. Furthermore, in some embodiments consistent with method 900, one or more of the steps illustrated may be performed in a different order, simultaneously, or at least partially overlapping in time.

Step 902 includes coupling the output of an inverting gate to the input of the inverting gate in a calibration mode of a receiver.

Step 904 includes charging a capacitor disposed between a reference voltage and the input of the inverting gate when the input and the output of the inverting gate reach equilibrium in the calibration mode.

Step 906 includes coupling an input of the inverting gate to an input signal through the capacitor.

Step 908 includes interleaving an operational mode of the receiver with the calibration mode in a selected duty cycle. In some embodiments, step 908 includes apportioning a smaller fraction of the duty cycle to the calibration mode relative to the operational mode. In some embodiments, step 908 further includes receiving, with the receiver, an input signal comprising a datum from a processor, and providing a buffered output signal comprising the datum to a memory. In some embodiments, step 908 further includes providing, with the multiplexer and through the output, a buffered output signal alternatively from the first channel and the second channel to form a continuous output signal.

In one aspect, a method may be an operation, an instruction, or a function and vice versa. In one aspect, a clause or a claim may be amended to include some or all of the words (e.g., instructions, operations, functions, or components) recited in other one or more clauses, one or more words, one or more sentences, one or more phrases, one or more paragraphs, and/or one or more claims.

To illustrate the interchangeability of hardware and software, items such as the various illustrative blocks, modules, components, methods, operations, instructions, and algorithms have been described generally in terms of their functionality. Whether such functionality is implemented as hardware, software, or a combination of hardware and software depends upon the particular application and design constraints imposed on the overall system. Skilled artisans may implement the described functionality in varying ways for each particular application.

As used herein, the phrase "at least one of" preceding a series of items, with the terms "and" or "or" to separate any of the items, modifies the list as a whole, rather than each member of the list (e.g., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

In one aspect, a term field effect transistor (FET) may refer to any of a variety of multi-terminal transistors generally operating on the principals of controlling an electric field to control the shape, and hence the conductivity of a channel of one type of charge carrier in a semiconductor material, including, but not limited to, a metal oxide semiconductor field effect transistor (MOSFET), a junction FET (JFET), a metal semiconductor FET (MESFET), a high electron mobility transistor (HEMT), a modulation doped FET (MODFET), an insulated gate bipolar transistor (IGBT), a fast reverse epitaxial diode FET (FREDFET), and an ion-sensitive FET (ISFET).

To the extent that the term "include," "have," or the like is used in the description or the claims, such term is intended to be inclusive in a manner similar to the term "comprise" as "comprise" is interpreted when employed as a transitional word in a claim.

The word "exemplary" is used herein to mean "serving as an example, instance, or illustration." Any embodiment described herein as "exemplary" is not necessarily to be construed as preferred or advantageous over other embodiments. Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. Relational terms such as first, second, and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for."

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately, or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

The invention claimed is:

1. A device, comprising:
   an input configured to receive an input signal in an operational mode and to receive a reference voltage in a calibration mode;
   a capacitor configured to store a reference charge based on the reference voltage;
   an input inverter configured to capture a transition of the input signal, the input inverter coupled in series with the capacitor so that the transition of the input signal occurs when a voltage of the input signal crosses the reference voltage; and
   an output inverter, coupled in series with the input inverter, and configured to provide an output signal having a parity of the input signal.

2. The device of claim 1, further comprising an inverter switch configured to electrically couple an output node in the input inverter to an input node in the input inverter when the device is in the calibration mode, and to electrically decouple the output node and the input node when the device is in the operational mode.

3. The device of claim 1, further comprising a mode switch configured to electrically couple the input with the input signal in the operational mode and with the reference voltage in the calibration mode.

4. The device of claim 1, further comprising a filter to restore a high frequency component of the input signal.

5. The device of claim 1, wherein the reference voltage is constant, relative to a varying environmental condition, the varying environmental condition comprising one of a power, a voltage, and a temperature of the device.

6. The device of claim 1, wherein the input is configured to alternate between the operational mode and the calibration mode with a duty cycle that emphasizes the operational mode over the calibration mode.

7. The device of claim 1, wherein the input signal is a datum provided by a memory circuit when the device is located in a processor circuit coupled to the memory circuit, or by the processor circuit when the device is located in the memory circuit.

8. The device of claim 1, wherein the input signal is a digital signal configured in a non-return to zero protocol.

9. The device of claim 1, wherein a threshold voltage for the input inverter is maintained at the reference voltage when a common mode voltage of the input signal varies within a range comparable to the voltage of the input signal.

10. A system, comprising:
    a first receiver channel comprising:
        a first input configured to receive an input signal in a first operational mode and to receive a reference voltage in a first calibration mode;
        an input inverter configured to capture a transition of the input signal when a voltage of the input signal crosses the reference voltage;
    a second receiver channel configured to:
        receive the input signal in a second operational mode, and
        receive the reference voltage in a second calibration mode; and
    a multiplexer configured to provide an output signal based on the input signal in a continuous overlap of the first operational mode and the second operational mode.

11. The system of claim 10, wherein the first receiver channel comprises an output inverter coupled in series with the input inverter to provide the output signal with a parity of the input signal.

12. The system of claim 10, wherein the first receiver channel comprises a capacitor to store a reference charge when the first channel is in the first calibration mode, and wherein the input inverter is coupled in series with the capacitor.

13. The system of claim 10, wherein the first receiver channel further comprises an inverter switch configured to electrically couple an output node in the input inverter to an input node in the input inverter when the system is in the first calibration mode, and to electrically decouple the output node and the input node when the system is in the first operational mode.

14. The system of claim 10, wherein the first receiver channel further comprises a mode switch configured to electrically couple the first input with the input signal in the first operational mode and with the reference voltage in the first calibration mode.

15. The system of claim 10, wherein the first receiver channel further comprises a filter to restore a high frequency component of the input signal.

16. The system of claim 10, wherein the reference voltage is constant relative to a varying environmental condition, the varying environmental condition comprising one of a power, a voltage, and a temperature of the system.

17. A method, comprising:
    coupling an output of an inverting gate to an input of the inverting gate in a calibration mode of a receiver;
    charging a capacitor disposed between a reference voltage and the input of the inverting gate when the input and the output of the inverting gate reach an equilibrium in the calibration mode;
    coupling an input of the inverting gate to an input signal through the capacitor; and
    interleaving an operational mode of the receiver with the calibration mode in a duty cycle.

18. The method of claim 17, wherein interleaving an operational mode of the receiver with the calibration mode comprises apportioning a smaller fraction of the duty cycle to the calibration mode relative to the operational mode.

19. The method of claim 17, further comprising, with the receiver, receiving an input signal comprising a datum from a processor, and providing a buffered output signal comprising the datum to a memory.

20. The method of claim 17, wherein the receiver comprises a first channel and a second channel, and a multiplexer coupled to the first channel, the second channel, and an output, the method further comprising providing, with the multiplexer and through the output, a buffered output signal alternatively from the first channel and the second channel to form a continuous output signal.

* * * * *